United States Patent [19]
Pawlowski et al.

[11] Patent Number: 5,338,641
[45] Date of Patent: Aug. 16, 1994

[54] POSITIVE-WORKING RADIATION-SENSITIVE MIXTURE AND COPYING MATERIAL PRODUCED THEREFROM COMPRISING AN α,α-BIS(SULFONYL) DIAZO METHANE AS AN ACID FORMING COMPOUND

[75] Inventors: Georg Pawlowski, Wiesbaden; Hans-Joachim Merrem, Seeheim-Jugenheim; Juergen Lingnau, Mainz-Laubenheim; Ralph Dammel, Klein-Winterheim; Horst Roeschert, Biebelried, all of Fed. Rep. of Germany

[73] Assignee: Hoechst Aktiengesellschaft, Frankfurt am Main, Fed. Rep. of Germany

[21] Appl. No.: 26,077

[22] Filed: Mar. 4, 1993

Related U.S. Application Data

[63] Continuation of Ser. No. 578,465, Sep. 7, 1990, abandoned.

[30] Foreign Application Priority Data

Sep. 9, 1989 [DE] Fed. Rep. of Germany ....... 3930086

[51] Int. Cl.$^5$ .......................... G03F 7/022; G03C 1/76
[52] U.S. Cl. .................................... 430/165; 430/189; 430/191; 430/192; 430/270; 430/271; 430/275; 522/59
[58] Field of Search ............... 430/192, 193, 165, 189, 430/191, 270, 910, 907, 271, 275; 522/59

[56] References Cited

U.S. PATENT DOCUMENTS

| | | | |
|---|---|---|---|
| 3,515,552 | 6/1970 | Smith | 96/35.1 |
| 3,536,489 | 10/1970 | Smith | 96/28 |
| 3,615,455 | 10/1971 | Laridon et al. | 96/35.1 |
| 3,615,630 | 10/1971 | Dietrich | 96/115 P |
| 3,686,084 | 8/1972 | Rosenkranz | 204/159.15 |
| 3,779,778 | 12/1973 | Smith et al. | 96/115 R |
| 3,912,606 | 10/1975 | Pacifici et al. | 204/159.15 |
| 4,101,323 | 7/1978 | Buhr et al. | 430/270 |
| 4,189,323 | 2/1980 | Buhr | 430/281 |

(List continued on next page.)

FOREIGN PATENT DOCUMENTS

| | | |
|---|---|---|
| 0232972 | 8/1987 | European Pat. Off. . |
| 0135348 | 2/1989 | European Pat. Off. . |
| 0302359 | 2/1989 | European Pat. Off. . |

(List continued on next page.)

OTHER PUBLICATIONS

Willson, "Organic Resist Materials—Theory and Chemistry," Introduction to Microlithography, ACS Symp. Ser., 219: 87, 1983, pp. 87–159.

Crivello, "Possibilities for Photoimaging Using Onium Salts," Polymer Engineering and Science, Dec. 1983, vol. 23, No. 18, pp. 953–956.

Houlihan et al., "An evaluation of nitrobenzyl ester chemistry for chemical amplification resists," SPIE vol. 920 Advances in Resist Technology and Processing V, 1988, pp. 67–74.

Primary Examiner—Charles L. Bowers, Jr.
Assistant Examiner—John S. Chu
Attorney, Agent, or Firm—Foley & Lardner

[57] ABSTRACT

A positive-working radiation-sensitive mixture is disclosed which contains as essential constituents:

a) an α,α-bis(sulfonyl)diazomethane, which forms a strong acid on irradiation, of the general formula

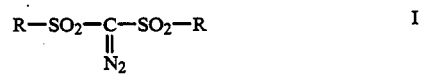

in which
R is an optionally substituted alkyl, cycloalkyl, aryl or heteroaryl radical, b) a compound having at least one C—O—C or C—O—Si—bond which can be cleaved by acid, and c) a water-insoluble binder which is soluble or at least swellable in aqueous alkaline solutions.

The radiation-sensitive mixture according to the invention is notable for a high sensitivity over a wide spectral range. It also exhibits a high thermal stability and does not form any corrosive photolysis products on exposure to light.

25 Claims, No Drawings

U.S. PATENT DOCUMENTS

| | | | |
|---|---|---|---|
| 4,212,970 | 7/1980 | Iwasaki | 542/455 |
| 4,232,106 | 11/1980 | Iwasaki et al. | 430/170 |
| 4,247,611 | 1/1981 | Sander et al. | 430/192 |
| 4,248,957 | 2/1981 | Sander et al. | 430/270 |
| 4,250,247 | 2/1981 | Sander et al. | 430/270 |
| 4,279,982 | 7/1981 | Iwasaki et al. | 430/170 |
| 4,311,782 | 1/1982 | Buhr et al. | 430/270 |
| 4,343,885 | 8/1982 | Reardon, Jr. | 430/270 |
| 4,371,606 | 2/1983 | Dönges | 430/281 |
| 4,371,607 | 2/1983 | Dönges | 430/281 |
| 4,491,628 | 1/1985 | Ito et al. | 430/176 |
| 4,506,003 | 3/1985 | Ruckert et al. | 430/270 |
| 4,506,006 | 3/1985 | Ruckert | 430/325 |
| 4,603,101 | 7/1986 | Crivello | 430/270 |
| 4,619,998 | 10/1986 | Buhr | 544/193.1 |
| 4,696,888 | 9/1987 | Buhr | 430/270 |
| 4,737,426 | 4/1988 | Roth | 430/17 |
| 4,786,577 | 11/1988 | Aoai et al. | 430/192 |
| 4,806,448 | 2/1989 | Roth | 430/270 |
| 4,840,867 | 6/1989 | Elsaesser et al. | 430/156 |
| 5,250,669 | 10/1993 | Ogawa et al. | 430/192 |
| 5,272,036 | 12/1993 | Tani et al. | 430/192 |

FOREIGN PATENT DOCUMENTS

| | | |
|---|---|---|
| 0315748 | 5/1989 | European Pat. Off. . |
| 1298414 | 6/1969 | Fed. Rep. of Germany . |
| 3601264 | 7/1986 | Fed. Rep. of Germany . |
| 3730783 | 3/1989 | Fed. Rep. of Germany . |
| 3730785 | 3/1989 | Fed. Rep. of Germany . |
| 3730787 | 3/1989 | Fed. Rep. of Germany . |
| 7030676 | 9/1971 | France . |
| 87/7165 | 4/1985 | South Africa . |
| 1163324 | 9/1969 | United Kingdom . |
| 1231789 | 5/1971 | United Kingdom . |
| 1234648 | 6/1971 | United Kingdom . |
| 1381471 | 1/1975 | United Kingdom . |
| 1381472 | 1/1975 | United Kingdom . |
| 1388492 | 3/1975 | United Kingdom . |

POSITIVE-WORKING RADIATION-SENSITIVE MIXTURE AND COPYING MATERIAL PRODUCED THEREFROM COMPRISING AN α,α-BIS(SULFONYL) DIAZO METHANE AS AN ACID FORMING COMPOUND

This application is a continuation, of application Ser. No. 07/578,465, filed Sep. 7, 1990, now abandoned.

BACKGROUND OF THE INVENTION

The present invention relates to a positive-working radiation-sensitive mixture which contains as essential constituents:
- a) a compound which forms a strong acid on irradiation,
- b) a compound having at least one C—O—C or C—O—Si bond which can be cleaved by acid, and
- c) a water-insoluble binder which is soluble or at least swellable in aqueous alkaline solutions.

The invention also relates to a radiation-sensitive copying material produced from this mixture which is suitable for producing photoresists, electronic components, printing plates or for chemical milling.

In UV lithography, the limit of resolution is governed by the wavelength of the radiation used. The continuous miniaturization of the structural dimensions, for example, in chip production, therefore requires modified lithographic techniques in the submicron region. Owing to their short wavelength, high-energy UV light or electron beams and X-ray beams, for example, are used. This modification of the lithographic techniques changes the requirements imposed on the radiation-sensitive mixture. A summary of these requirements is given, for example, in the treatise by C. G. Willson entitled "Organic Resist Materials - Theory and Chemistry" (Introduction to Microlithography, Theory, Materials, and Processing, edited by L. F. Thompson, C. G. Willson, M. J. Bowden, ACS Symp. Ser., 219: 87 (1983), American Chemical Society, Washington). There is therefore an intensified requirement for radiation-sensitive mixtures which are preferably sensitive in a wide spectral range and can accordingly be used in conventional UV lithography or, without a loss in sensitivity, in advanced technologies such as, for example, mid-UV or deep-UV, electron or X-ray lithography.

Mixtures containing acid donors and acid-cleavable compounds are described, for example, in DE 2,306,248 (=U.S. Pat. No. 3,779,778), 2,610,842 (=U.S. Pat. No. 4,101,323), 2,718,254 (=U.S. Pat. No. 4,247,611), 2,718,259 (=U.S. Pat. No. 4,189,323), 2,928,636 (=U.S. Pat. No. 4,311,782), 3,151,078 (=U.S. Pat. No. 4,506,006), 3,544,165 (=U.S. Pat. No. 4,786,577), 3,601,264, 3,730,783, 3,730,785 and 3,730,787, in EP 0,006,626 (=U.S. Pat. No. 4,250,247), 0,006,627 (=U.S. Pat. No. 4,248,957), 0,042,562 (=U.S. Pat. No. 4,506,003), 0,202,196 and 0,302,359, and also in U.S. Pat. Nos. 4,491,628 and 4,603,101. Upon irradiation of these materials, photolysis of the compound (a) forms an acid which brings about a cleavage of the C—O—C or C—O—Si bond of the compound (b) so that the irradiated regions of the photosensitive layers become soluble in an aqueous alkaline developer.

Compounds (a) are characterized as photolytic acid donors and include, in particular, onium salts such as diazonium, phosphonium, sulfonium and iodonium salts of non-nucleophilic acids, for example of $HSbF_6$, $HAsF_6$, or $HPF_6$ (J. V. Crivello, Polym. Eng. Sci., 23:953 (1983)), halogen compounds (EP 0,232,972, DE 1,572,089 (=GB 1,163,324), DE 1,817,540 (=U.S. Pat. No. 3,615,455), DE 1,949,010 (=U.S. Pat. No. 3,686,084), DE 2,317,846 (=GB 1,381,471 and 1,381,472), U.S. 3,912,606), in particular trichloromethyl triazine derivatives (DE 1,298,414 (=GB 1,234,648), 2,243,621 (=GB 1,388,492), 2,306,248, 2,718,259, 3,333,450 (=ZA 84/7165) and 3,337,024 (=U.S. Pat. Nos. 4,619,998 and 4,696,888) and also U.S. Pat. Nos. 3,515,552, 3,536,489 and 3,615,630) or trichloromethyl oxadiazole derivatives (DE 2,851,472 (=U.S. Pat. Nos. 4,212,970 and 4,232,106), 2,949,396 (=U.S. Pat. No. 4,279,982), 3,021,590 (=U.S. Pat. No. 4,371,607), 3,021,599 (=U.S. Pat. No. 4,371,606) and DE 3,333,450), o-quinonediazidesulfochlorides or organometal/organohalogen combinations.

The use of such photolytic acid donors, however, involves certain disadvantages which drastically restrict their possible uses in various fields of application. For example, many of the onium salts are toxic. Their solubility in many solvents is inadequate, which results in a limitation of the choice of resist-coating solvents. If the onium salts are used, some undesirable foreign atoms are introduced which may result in processing troubles, in particular in microlithography. Furthermore, during the photolysis they form Bronstedt acids with very strong corrosive action which render the use of radiation-sensitive mixtures containing them unsatisfactory on sensitive substrates.

The halogen compounds and also the quinonediazide sulfonyl chlorides form hydrohalic acids with strong corrosive action. On certain substrates, such compounds have only a limited storage life. According to the teachings of DE 3,621,376 (=U.S. Pat. No. 4,840,867), this was improved in the past by introduction of an intermediate layer between substrate and radiation-sensitive layer containing compounds of the type (a), but this resulted in an undesirable increase in defects and a reduction in the process reproducibility. In addition, it was generally believed that compounds of the type (b) can be cleaved only by the acid types described above which have good mobility in the photosensitive layer.

Recent work by F. M. Houlihan et al., SPIE 920:67 (1988) has shown that, in addition to the above-mentioned acid donors, nitrobenzyl tosylates, which form sulfonic acids of low mobility on exposure to light, can be used in certain acid-labile resist formulations. The sensitivities achieved in such cases and the thermal stabilities of the photoresists have, however, proven inadequate.

Owing to the disadvantages cited there is therefore a need for further acid donors which act photolytically, which do not have the disadvantages described above as constituents of radiation-sensitive mixtures and which consequently have sufficient reactivity and acid strength to convert compounds of the type (b) into their cleavage products even with short exposure times.

SUMMARY OF THE INVENTION

It is therefore an object of the present invention to provide a radiation-sensitive mixture based on acid-forming compounds in combination with compounds which can be cleaved by acid, in which mixture the compound which forms an acid photolytically is as stable as possible on all known substrates and generates an acid with noncorrosive action as the photolytic product.

In accomplishing these and other objects according to the invention, a positive-working radiation-sensitive mixture is provided that consists essentially of a) a compound which forms an acid on irradiation, b) a compound having at least one C—O—C or C—O—Si bond which can be cleaved by acid, and c) a water-insoluble binder which is soluble or at least swellable in aqueous alkaline solutions, wherein the compound (a) is an α,α-bis(sulfonyl)diazomethane derivative of the formula

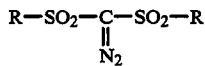 I in which R is an alkyl, cycloalkyl, aryl or heteroaryl radical. A positive-working radiation-sensitive copying material consists essentially of a layer of this mixture coated on a support.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A radiation-sensitive mixture according to the invention contains as essential constituents:
a) a compound which forms a strong acid on exposure to actinic radiation,
b) a compound having at least one C—O—C or C—O—Si bond which can be cleaved by acid, and
c) a water-insoluble binder which is soluble or at least swellable in aqueous alkaline solutions.

The mixture according to the invention is one wherein the compound (a) which forms a strong acid on irradiation is an α,α-bis(sulfonyl)diazomethane of the general formula I

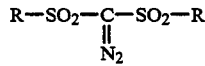 I in which
R is an optionally substituted alkyl, cycloalkyl, aryl or heteroaryl radical.

A radiation-sensitive copying material according to the invention contains this mixture as a radiation-sensitive layer on a support.

The radiation-sensitive mixture according to the invention has a high sensitivity over a wide spectral range. It exhibits a high thermal stability and is capable of reproducing even the finest structures of a master with structural precision. No corrosive photolysis products are formed by the exposure to light, with the result that the mixture can be used even on sensitive substrate materials.

In the preparation of the radiation-sensitive mixture, it is possible to use compounds of the general formula I in which R is an optionally substituted alkyl or cycloalkyl radical, an optionally substituted aryl radical or an optionally substituted heteroaryl radical.

Examples of suitable substituents R in α,α-bis(sulfonyl)diazomethanes of the general formula I include methyl, ethyl, propyl, butyl, pentyl, hexyl, cyclohexyl, nonyl, decyl, or undecyl groups, and also their positional isomers, aryl such as benzene and naphthalene, hetero-aromatic compounds containing O, N or S as heteroatom and also their derivatives in which one or more hydrogen atoms are substituted, for example, by alkyl, alkoxy, alkoxyalkyl, aryl, aryloxy, arylalkoxy, halo, cyano, nitro, carbonyl, carboxyl, amido or similar radicals. Particularly preferred substituents are alkyl, alkoxy, alkoxyalkyl, carbonyl, amido, nitro radicals or halogens, alkyl or alkoxy radicals containing in particular 1 to 4 carbon atoms. If there is polysubstitution of the aromatic radicals, suitable substituents are predominantly alkyl or halogens. In particular, these are then disubstituted radicals R. If, however, fluorine is a substituent of the radical R, more than two fluorine atoms may also be encountered as substituents of the radical R; the latter are not, however, preferred. If R is heteroaryl, it comprises at most predominantly one heteroatom, even if R is a binuclear radical. If N is chosen as a heteroatom, it may occur at most twice per nucleus.

Among the compounds of the general formula I in which R is an alkyl radical, those are preferred which contain 1 to 6 carbon atoms, and among those in which R is an aryl radical, those are preferred in which R is a mononuclear or binuclear aromatic radical.

Examples of particularly suitable α,α-bis(sulfonyl)-diazomethanes of the general formula I are:
Bis(methylsulfonyl) diazomethane
Bis(ethylsulfonyl) diazomethane
Bis(propylsulfonyl)diazomethane
Bis(1-methylpropylsulfonyl)diazomethane
Bis(2-methylpropylsulfonyl)diazomethane
Bis(butylsulfonyl)diazomethane
Bis(1-methylbutylsulfonyl)diazomethane
Bis(2-methylbutylsulfonyl)diazomethane
Bis(3-methylbutylsulfonyl)diazomethane
Bis(allylsulfonyl)diazomethane
Bis(heptylsulfonyl)diazomethane
Bis(octylsulfonyl)diazomethane
Bis(nonylsulfonyl)diazomethane
Bis(decylsulfonyl)diazomethane
Bis(dodecylsulfonyl)diazomethane
Bis(trifluoromethylsulfonyl)diazomethane
Bis(hexadecylsulfonyl)diazomethane
Bis(cyclohexylsulfonyl)diazomethane
Bis(2-oxapentylsulfonyl)diazomethane
Bis(benzylsulfonyl)diazomethane
Bis(2-chlorobenzylsulfonyl)diazomethane
Bis(4-chlorobenzylsulfonyl)diazomethane
Bis(4-methoxysulfonyl)diazomethane
Bis(phenylsulfonyl)diazomethane
Bis(2-methylphenylsulfonyl)diazomethane
Bis(3-methylphenylsulfonyl)diazomethane
Bis(4-methylphenylsulfonyl)diazomethane
Bis(4-ethylphenylsulfonyl)diazomethane
Bis(2,4-dimethylphenylsulfonyl)diazomethane
Bis(2,5-dimethylphenylsulfonyl)diazomethane
Bis(3,4-dimethylphenylsulfonyl)diazomethane
Bis(4-t-butylphenylsulfonyl)diazomethane
Bis(2-methoxyphenylsulfonyl)diazomethane
Bis(3-methoxyphenylsulfonyl)diazomethane
Bis(4-methoxyphenylsulfonyl)diazomethane
Bis(2-chlorophenylsulfonyl)diazomethane
Bis(3-chlorophenylsulfonyl)diazomethane
Bis(4-chlorophenylsulfonyl)diazomethane
Bis(2,5-chlorophenylsulfonyl)diazomethane
Bis(2,6-chlorophenylsulfonyl)diazomethane Bis(3,4-chlorophenylsulfonyl)diazomethane
Bis(2-bromophenylsulfonyl)diazomethane
Bis(3-bromophenylsulfonyl)diazomethane
Bis(4-bromophenylsulfonyl)diazomethane
Bis(4-fluorophenylsulfonyl)diazomethane
Bis(2,4-difluorophenylsulfonyl)diazomethan
Bis(pentafluorophenylsulfonyl)diazomethane
Bis(4-nitrophenylsulfonyl)diazomethane
Bis(4-acetamidophenylsulfonyl)diazomethane
Bis(4-acetoxyphenylsulfonyl)diazomethane
Bis(2-naphthalinsulfonyl)diazomethane
Bis(furfurylsulfonyl)diazomethane
Bis(imidazolylsulfonyl)diazomethane
Bis(2-methylimidazolylsulfonyl)diazomethane
Bis(benzimidazole-2-sulfonyl)diazomethane
Bis(benzoxazole-2-sulfonyl)diazomethane
Bis(benzothiazole-2-sulfonyl)diazomethane.

The compounds cited above have absorption maxima in the region between 220 and 270 nm, and are therefore very well suited for irradiation with high-energy UV radiation.

Of the above-mentioned compounds of the general formula I in which R is a substituted aryl radical, the following compounds are particularly preferred:
Bis(2-methylphenylsulfonyl)diazomethane
Bis(3-methylphenylsulfonyl)diazomethane
Bis(4-methylphenylsulfonyl)diazomethane
Bis(4-ethylphenylsulfonyl)diazomethane
Bis(2,4-dimethylphenylsulfonyl)diazomethane
Bis(3,4-dimethylphenylsulfonyl)diazomethane
Bis(4-t-butylphenylsulfonyl)diazomethane
Bis(4-methoxyphenylsulfonyl)diazomethane
Bis(2-chlorophenylsulfonyl)diazomethane
Bis(3-chlorophenylsulfonyl)diazomethane
Bis(4-chlorophenylsulfonyl)diazomethane
Bis(2,5-dichlorophenylsulfonyl)diazomethane
Bis(2,6-dichlorophenylsulfonyl)diazomethane
Bis(3,4-dichlorophenylsulfonyl)diazomethane
Bis(3-bromophenylsulfonyl)diazomethane
Bis(4-bromophenylsulfonyl)diazomethane
Bis(4-fluorophenylsulfonyl)diazomethane
Bis(2,4-difluorophenylsulfonyl)diazomethane
Bis(4-nitrophenylsulfonyl)diazomethane
Bis(4-acetoxyphenylsulfonyl)diazomethane.

These compounds are particularly suitable because, on the one hand, they have a high photolysis reactivity, and, on the other hand, they have an adequate thermal stability.

The preparation of the $\alpha,\alpha$-bis(arylsulfonyl)diazomethane derivatives according to the invention is known per se. Their preparation has been described, for example, by F. Klages et al., *Chem. Ber.*, 97:735 (1964).

In addition, their use as dissolution inhibitors for positive-working materials, in particular for printing plates, has been investigated in the past by A. Poot et al., *J. Photogr. Sci.*, 19: 88 (1971); their practical suitability in photoresist formulations was, however, ruled out because of inadequate photosensitivity.

It was therefore particularly surprising that the compounds of the general formula I used according to the invention form, during their photolysis, adequate quantities of sufficiently strong acids which make it possible to produce the highly sensitive, positive-working radiation-sensitive mixture according to the invention. Although there are no precise ideas about the extent and the nature of the acids formed, it may be assumed that sulfonic and sulfinic acids form as a result of the photolysis and these are capable of cleaving the labile bond of the compounds of the type (b).

Compared with the photolytically produced acids hitherto used such as, for example, hydrochloric acid, these acids have, as a consequence of their high molecular weight, a much lower diffusion tendency or mobility in the radiation-sensitive mixture according to the invention. It was surprising that it was possible to achieve an image differentiation satisfying the highest requirements, and even more surprising that, for comparable sensitivity, the contrast, and consequently the resolving power, of the radiation-sensitive mixture was increased further. It was also surprising that the $\alpha,\alpha$-bis(sulfonyl)-diazomethanes of the general formula I can be activated by high-energy short-wave radiation and it is consequently possible, for example, to produce a highly sensitive photoresist for high-energy UV2 radiation (248 nm). In particular, however, it was unexpected that an adequate spectral sensitivity is still present even in the conventional optical lithography region (436 nm).

In this connection, actinic radiation is to be understood to mean any radiation whose energy is equivalent at least to that of short-wave visible light. In particular, UV radiation in the range from 190 to 450 nm, preferably from 200 to 400 nm, particularly preferably from 200 to 300 nm, but also electron radiation and X-rays are suitable.

The preparation of the $\alpha,\alpha$-bis(arylsulfonyl)diazomethanes used according to the invention, some of which are novel, is illustrated on the basis of the preferred bis(4-t-butylphenylsulfonyl)diazomethane (pbw=parts by weight). In this preparation, 37.3 pbw of 4-t-butylthiophenol are added to 100 pbw of sodium hydroxide and stirred at room temperature until a clear solution forms. Dichloromethane (18.2 pbw) is added to the thiophenol solution. The mixture is heated under reflux for 8 hours. The formaldehyde bis(4-t-butylphenylmercaptal) produced is taken up in ether and washed twice with 200 ml of water. Drying is then carried out over magnesium sulfate and the ether is distilled off. Thirty-six pbw of a colorless oil are left behind.

Twenty pbw of this oil are dissolved in 40 ml of glacial acetic acid and added dropwise to a mixture of 200 pbw of glacial acetic acid and 60 pbw of hydrogen peroxide preheated to 90° C., the drop rate being so regulated that the temperature remains below 100° C. After completion of the initially strongly exothermic reaction, heating is carried out for a further 2 hours at 100° C., the mixture is cooled and poured into water. This produces 16 pbw of bis(4-t-butylphenylsulfonyl)methane. The product is recrystallized from ethanol and is obtained with a melting point of 150° to 152° C.

Ten pbw of this product are dissolved together with 4.8 pbw of tosylazide in 90 pbw of acetonitrile and cooled to 0° C. Triethylamine (2.5 pbw) is added dropwise to this mixture in a manner such that the temperature remains below 10° C. Stirring of the mixture is continued for 4 hours at room temperature and the solvent is then removed from the mixture. The residue is taken up in methylene chloride and extracted twice with 100 pbw of 5%-strength aqueous sodium hydroxide solution, washed until neutral and dried. After evaporating the solvent, an oil is left behind which is filtered through a silicic acid with methylene chloride as solvent. Re-evaporation of the solution produces a solid having a decomposition point of 153° to 155° C., which proves to be analytically pure bis(4-t-butylphenylsulfonyl)diazomethane.

The analysis of this compound yielded the following values:

calc.: C 58.04%, H 6.03%, N 6.45% S 14.75% found: C 57.9%, H 6.1%, N 6.5% S 14.4% $^1$H-NMR (CDCl$_3$): 1.4 ppm (s, 18 H), 7.4 to 8.2 ppm (q, 8 H) $\lambda_{max}$ (CHCl$_3$)=238, 248 nm.

The other above-mentioned compounds of the general formula I can be prepared in an analogous manner.

The photolytic acid donors contained in the radiation-sensitive mixture according to the invention can be used alone or in combination with other acid donors of the category mentioned. Combinations with other photolytic acid donors are, however, also possible, for which purpose, in particular, the α-sulfonyl-α-carbonyldiazomethanes described in U.S. application Ser. No. 08/046,484 (corresponding to German application P 3,930,087.0) filed simultaneously herewith are suitable.

In addition, the acid donors of the general formula I according to the invention can also be combined with onium salts such as diazonium, phosphonium, sulfonium and iodonium salts of non-nucleophilic acids, for example, of HSbF$_6$, HAsF$_6$, or HPF$_6$ (J. V. Crivello, Polym. Eng. Sci., 23:953 (1983)), halogen compounds (DE 1,572,089, 1,817,540, 1,949,010 and 2,317,846, EP 0,232,972, U.S. Pat. No. 3,912,606), in particular trichloromethyl triazine derivatives (DE 1,298,414, 2,243,621, 2,306,248, 2,718,259, 3,333,450 and 3,337,024, U.S. Pat. No. 3,515,552, 3,536,489 and 3,615,630) or trichloromethyloxadiazole derivatives (DE 2,851,472, 2,949,396, 3,021,590, 3,021,599 and 3,333,450 and also EP 135,348), o-quinonediazidesulfochlorides or organometal/organohalogen combinations. Such combinations are not, however, preferred, since the disadvantages mentioned in the background again occur in such radiation-sensitive mixtures.

The content of acid donors of the general formula I in the mixture according to the invention is generally between about 0.5 and 25% by weight, preferably about 1 to 10% by weight, based in each case on the total weight of the layer.

As the material which can be cleaved by acid in the radiation-sensitive mixture according to the invention the following compound categories, in particular, have proven successful:

a) those containing at least one orthocarboxylic acid ester and/or carboxylic acid amide acetal grouping, the compounds also being capable of having a polymeric nature and the groupings mentioned being capable of occurring as linking elements in the main chain or as lateral substituents,
b) oligomeric or polymeric compounds containing repeating acetal and/or ketal groupings in the main chain,
c) compounds containing at least one enol ether or N-acyliminocarbonate grouping,
d) cyclic acetals or ketals of β-keto esters or β-keto amides,
e) compounds containing silyl ether groupings,
f) compounds containing silyl enol ether groupings,
g) monoacetals or monoketals whose aldehydes or ketone components have a solubility in the developer of between 0.1 and 100 g/l,
h) ethers based on tertiary alcohols, and
i) carboxylic acid esters and carbonates of tertiary allylic or benzylic alcohols.

As components of radiation-sensitive mixtures, compounds of type (a) which can be cleaved by acids are described in detail in DE 2,610,842 and 2,928,636. Mixtures which contain compounds of type (b) are disclosed in DE 2,306,248 and 2,718,254. Compounds of type (c) are described in EP 0,006,626 and 0,006,627. Compounds of type (d) are disclosed in EP 0,202,196 and compounds of type (e) are disclosed in DE 3,544,165 and 3,601,264. Compounds of type (f) are found in DE 3,730,785 and 3,730,783, while compounds of type (g) are dealt with in DE 3,730,787. Compounds of type (h) are described, for example, in U.S. Pat. No. 4,603,101 and compounds of type (i), for example, in U.S. Pat. No. 4,491,628 and also in J. M. Fréchet et al., J. Imaging Sci. 30, 59–64 (1986).

Mixtures of the materials mentioned which can be cleaved by acids may also be used. Preferred, however, is a material of one of the above-mentioned types, having a C—O—C bond which can be cleaved by acid. Particularly preferred are those materials which belong to types (a), (b), (g) and (i). Among type (b), the polymeric acetals must, in particular, be highlighted; of the materials of type (g) which can be cleaved by acid, in particular those whose aldehyde or ketone component has a boiling point of higher than 150° C., preferably higher than 200° C., must be highlighted.

The content of material which can be cleaved by acid in the radiation-sensitive mixture according to the invention should be about 1 to 50% by weight, preferably about 5 to 25% by weight, based in each case on the total weight of the layer.

The radiation-sensitive mixture according to the invention furthermore contains at least one polymeric water-insoluble binder which is soluble, or at least swellable, in aqueous-alkaline solutions. The binder is distinguished, in particular, by the fact that it readily dissolves the constituents of the radiation-sensitive mixture according to the invention and has an inherent absorption that is as low as possible, i.e., a high transparency, in particular in the wavelength range from 190 to 300 nm. This does not include, in particular, those binders based on novolak condensation resins which generally have been used in combinations of naphthoquinonediazides as photoactive components. Although novolak condensation resins reveal a drop in solubility in aqueous-alkaline developers in the unexposed regions after exposure to an image, their inherent absorption is undesirably high in the wavelength range required for the exposure to light.

The novolak condensation resins mentioned may, however, be used in a mixture with other resins having high transparency and being suitable as binders. In this connection, the mixing ratios depend predominantly on the nature of the binder to be mixed with the novolak resin. In particular, a decisive role is played by its degree of inherent absorption in the wavelength range mentioned, and also by its miscibility with the other constituents of the radiation-sensitive mixture. In general, however, the binder of the radiation-sensitive mixture according to the invention may contain up to about 30% by weight, in particular up to about 20% by weight, of a novolak condensation resin.

Suitable binders are homopolymers or copolymers of p-hydroxystyrene and also of its alkyl derivatives, for example, of 3-methylhydroxystyrene, and also homopolymers or copolymers of other polyvinylphenols, for example, of 3-hydroxystyrene or the esters or amides of acrylic acids with aromatics containing phenolic groups. Polymerizable compounds such as styrene, methacrylic acid methacrylate, acrylic acid methacrylate or the like can be used as comonomers in the copolymer.

Mixtures with increased resistance to plasma etching are obtained if vinyl monomers containing silicon, for example vinyltrimethylsilane, are used to prepare copolymers of the above type. The transparency of these binders is generally higher in the range of interest, with the result that an improved patterning is possible.

Homopolymers or copolymers of maleinimide can also be used with the same success. These binders also exhibit high transparency in the wavelength range described. Styrene, substituted styrenes, vinyl ethers, vinyl esters, vinylsilyl compounds or (meth)acrylic acid esters are also used as comonomers.

Finally, it is also possible to use copolymers of styrene with comonomers which bring about an increase in solubility in aqueous-alkaline solutions. These include, for example, maleic anhydride, maleic acid half-esters or the like.

The binders mentioned may occur in mixtures if they are miscible and do not impair the optical qualities of the radiation-sensitive mixture. Preferred, however, are binders containing one species of the above-mentioned types.

The quantity of binder is, in general, about 1 to 90% by weight, in particular about 5 to 90% by weight, preferably about 50 to 90% by weight, based on the total weight of the radiation-sensitive mixture.

Optionally, dyestuffs, pigments, plasticizers, wetting agents and leveling agents, but also polyglycols, cellulose ethers, for example, ethylcellulose, may be added to the radiation-sensitive mixtures according to the invention to improve specific requirements such as flexibility, adherence and luster.

Preferably, the radiation-sensitive mixture according to the invention is dissolved in solvents for example, ethylene glycol, glycol ether, glycol monomethyl ether, glycol dimethyl ether, glycol monoethyl ether or propylene glycol monoalkyl ether, in particular propylene glycol methyl ether, aliphatic esters, for example, ethyl acetate, hydroxyethyl acetate, alkoxyethyl acetate, n-butyl acetate, propylene glycol monoalkyl ether acetate, in particular propylene glycol methyl ether acetate or amyl acetate, ethers for example, dioxan, ketones, for example, methyl ethyl ketone, methyl isobutyl ketone, cyclopentanone and cyclohexanone), dimethylformamide, dimethyl acetamide, hexamethylphosphoric acid triamide, N-methylpyrrolidone, butyrolactone, tetrahydrofuran and mixtures of the same. Particularly preferred are glycol ether, aliphatic esters and also ketones.

Ultimately the choice of solvents depends on the coating method used, the desired layer thickness and the drying conditions. The solvent must also be chemically neutral, i.e., it must not react irreversibly with the other layer components.

The solutions produced with the constituents of the radiation-sensitive mixture generally have a solids content of about 5 to 60% by weight, preferably up to about 50% by weight.

According to the invention, a radiation-sensitive copying material is produced by coating a substrate with a layer of the radiation-sensitive mixture. Suitable substrates are all those materials of which capacitors, semiconductors, multilayer printed circuits or integrated circuits are composed or from which they are produced. In particular, mention may be made of surfaces composed of thermally oxidized silicon material and/or silicon material coated with aluminum which may optionally also be doped, and including all the other substrates common in semiconductor technology such as, for example, silicon nitride, gallium arsenide and indium phosphide. Furthermore, the substrates known from liquid crystal display production such as, for example, glass and indium tin oxide, metal plates and metal foils, for example, of aluminum, copper or zinc, bimetal and trimetal foils, and also electrically non-conducting sheets which are vapor-coated with metals, $SiO_2$ materials optionally coated with aluminum, and paper, are suitable. These substrates may be subjected to a thermal pretreatment, superficially roughened, incipiently etched or treated with reagents to improve the desired properties, for example, to increase the hydrophilic nature.

In a particular embodiment, the radiation-sensitive mixture may contain an adhesion promoter to improve adhesion in the resist or between the resist and the substrate. In the case of silicon or silicon dioxide substrates, adhesion promoters of the aminosilane type such as, for example, 3-aminopropyltriethoxysilane or hexamethyldisilazane are suitable for this purpose.

Examples of supports which can be used to produce photomechanical copying layers such as printing forms for letterpress printing, lithographic printing and screen printing and also of embossed copies are aluminum plates, optionally anodically oxidized, grained and/or silicatized, zinc plates and steel plates which have optionally been chromium-plated, and also plastic sheets or paper.

The copying material according to the invention is exposed to an image. Sources of actinic radiation include metal halide lamps, carbon arc lamps, xenon lamps and mercury vapor lamps. An exposure to high-energy radiation such as laser radiation, electron radiation or X-rays may also take place. Particularly preferred, however, are lamps which are able to radiate light of a wavelength from 190 to 260 nm, i.e., in particular xenon and/or mercury vapor lamps. In addition, laser light sources, for example excimer lasers, in particular KrF or ArF lasers which emit at 249 or 193 nm respectively, may also be used. The radiation sources must have an adequate emission in the wavelength ranges mentioned.

The layer thickness varies as a function of its field of application. It is between about 0.1 and 100 $\mu$m, in particular between about 1 and 10 $\mu$m.

The invention also relates to a method of producing a radiation-sensitive copying material. The radiation-sensitive mixture can be applied to the substrate by spraying-on, flow coating, rolling, spin coating and immersion coating. The solvent is then removed by evaporation, with the result that the radiation-sensitive layer remains behind on the surface of the substrate. The removal of the solvent can be promoted by heating the layer to temperatures of up to 150° C. The mixture may, however, first be applied in the above-mentioned manner to an intermediate support from which it is transferred under pressure and elevated temperature to the final support material. As intermediate supports, all the materials also identified as support materials can be used. The layer is then irradiated according to an image. An image pattern is revealed in the radiation-sensitive layer by development, the layer being treated with a developer solution which dissolves or removes the irradiated regions of the material.

As developers, solutions of reagents such as, for example, silicates, metasilicates, hydroxides, hydrogen or dihydrogenphosphates, carbonates or hydrogencarbonates, of alkali metals and/or alkaline earth metals, in particular of ammonium ions, but also ammonia and the like are used. Metal-ion-free developers are described in U.S. Pat. No. 4,729,941, EP 0,062,733, U.S. Pat. No. 4,628,023, U.S. Pat. No. 4,141,733, EP 0,097,282 and EP 0,023,758. The content of these substances in the developer solution is generally about 0.1 to 15% by weight, preferably about 0.5 to 5% by weight, based on the weight of the developer solution. Metal-ion-free developers are used in particular. Optionally, small quantities of a wetting agent may be added to the developers in order to facilitate the dissolution of the exposed areas in the developer.

The developed resist structures are optionally post-hardened. This is done, in general, by heating the resist structure on a hot plate to a temperature below the flow temperature and then exposing it to the UV light of a xenon-mercury vapor lamp (range from 200 to 250 nm) over its whole area. This post-hardening crosslinks the resist structures with the result that the structures generally have a flow resistance up to temperatures of over 200° C. The post-hardening may also be carried out without raising the temperature by irradiation with high-energy UV light.

The radiation-sensitive mixture is preferably used in lithographic processes for producing integrated circuits or discrete electrical components. The copying material produced from the mixture then serves as a mask for the subsequent processing steps. These include, for example, the etching of the support, the implantation of ions in the support or the deposition of metals or other materials on the support.

The examples described below are illustrative of the invention and are not intended to be limiting. Examples 1 to 8 confirm the suitability of the mixture according to the invention for copying materials in microlithography using radiation of a very wide range of energy. Comparison Examples 9 and 10 confirm the superiority of the mixtures according to the invention over the prior art. Examples 11 and 12 document the usability of the mixture in macroapplications, for example lithographic plates.

EXAMPLE 1

A coating solution was prepared from
- 7.5 pbw of a cresol-formaldehyde novolak having a softening range of 105° to 120° C.,
- 2.0 pbw of a p-methoxybenzaldehyde bis(phenoxyethyl)acetal prepared analogously to Preparation Example 1 of DE 3,730,787, and
- 0.7 pbw of bis(4-chlorophenylsulfonyl)diazomethane in
- 42 pbw of propylene glycol monomethyl ether acetate.

The solution was filtered through a filter having a pore diameter of 0.2 $\mu$m and spun onto a wafer treated with an adhesion promoter (hexamethyldisilazane) at 3,000 revolutions per minute. After drying at 100° C. for 1 minute on a hot plate, a layer thickness of 1.04 $\mu$m was obtained.

The copying material was exposed to an image under a master using the UV radiation of a xenon-mercury vapor lamp at 365 nm having an energy of 124 mJ/cm$^2$.

The copying material was developed with a 0.3N alkaline developer of the following composition:
- 5.3 pbw of sodium metasilicate nonahydrate,
- 3.4 pbw of trisodium phosphate dodecahydrate,
- 0.3 pbw of sodium dihydrogenphosphate and
- 91 pbw of completely softened water.

After a development time of 60 seconds, a fault-free image of the mask having steep resist edges was obtained, even structures of less than 1 $\mu$m being resolved in true detail. An examination of the edges of the resist profiles by means of scanning electron microscopy confirmed that these were virtually perpendicular to the substrate surface.

EXAMPLE 2

A coating solution was prepared from
- 7.5 pbw of a copolymer of styrene/p-hydroxystyrene (20/80) having an average molecular weight of 32,000,
- 2.0 pbw of 3,4-dimethoxybenzaldehyde bis(phenoxyethyl)acetal prepared analogously to Preparation Example 1 of DE 3,730,787 and
- 0.7 pbw of bis(4-bromophenylsulfonyl)diazomethane in
- 42 pbw of propylene glycol monomethyl ether acetate.

The solution was filtered through a filter having a pore diameter of 0.2 $\mu$m and spun onto a wafer treated with an adhesion promoter (hexamethyldisilazane) at 3,000 revolutions per minute. After drying at 100° C. for 1 minute on a hot plate, a layer thickness of 1.18 $\mu$m was obtained.

The copying material was exposed to an image under a master using the UV radiation of a xenon-mercury vapor lamp at 260 nm having an energy of 103 mJ/cm$^2$ and then processed with the developer described in Example 1.

After a development time of 60 seconds, a fault-free image of the mask having high edge stability was obtained, structures of less than 1 $\mu$m also being resolved in this case in true detail.

EXAMPLE 3

A wafer prepared in accordance with Example 2 was irradiated under a master using the UV light of a KrF excimer laser having a wavelength of 248 nm with an energy of 92 mJ/cm$^2$. After development, an image of the master in which even structures in the submicron region were reproduced in true detail was obtained similarly to Example 2.

EXAMPLE 4

The experiment of Example 1 was repeated, but UV light of a wavelength of 436 nm was used. In order to obtain an image of the master with sharp edges, an exposure energy of 280 mJ/cm$^2$ had to be used.

EXAMPLE 5

A coating solution was prepared from
- 7.5 pbw of a 1:1 copolymer of styrene and maleimide having a softening range of 165° to 180° C.,
- 2.0 pbw of benzaldehyde bis(phenoxyethyl)acetal prepared analogously to Preparation Example 1 of DE 3,730,787, and
- 0.7 pbw of bis(phenylsulfonyl)diazomethane in
- 42 pbw of propylene glycol monomethyl ether acetate.

The solution was filtered through a filter having a pore diameter of 0.2 m and spun onto a wafer treated with an adhesion promoter (hexamethyldisilazane) at 3,500 revolutions per minute. After drying at 100° C. for 1 minute on a hot plate, a layer thickness of 1.08 μm was obtained.

The copying material was exposed to an image under a master using the UV radiation of a xenon-mercury vapor lamp at 260 nm having an energy of 88 mJ/cm$^2$.

The copying material was developed with a 0.02N aqueous solution of tetramethyl ammonium hydroxide, the exposed regions being stripped to leave no residue within 60 seconds.

Once more a fault-free image of the mask with satisfactorily steep resist edges was obtained. The removal of unexposed area was less than 20 nm; even structures of less than 1 μm were resolved in true detail.

EXAMPLE 6

A coating solution was prepared from 7.5 pbw of a 1:1 copolymer of styrene and maleimide having a softening range of 165° to 180° C., 2.0 pbw of 3,4-methylenedioxybenzaldehyde bis(-phenoxyethyl)acetal, 0.8 pbw of bis(t-butylphenylsulfonyl)diazomethane in 42 pbw of propylene glycol monomethyl ether acetate.

The solution was filtered through a filter having a pore diameter of 0.2 μm and spun onto a wafer treated with an adhesion promoter (hexamethyldisilazane) at 3,500 revolutions per minute. After drying at 100° C. for 1 minute on a hot plate, a layer thickness of 1.06 μm was obtained.

The copying material was exposed to an image under a master using the UV radiation of a xenon-mercury vapor lamp at 260 nm having an energy of 92 mJ/cm$^2$.

The copying material was developed with a 0.02N aqueous solution of tetramethylammonium hydroxide, the exposed regions being stripped to leave no residue within 60 seconds and a true-to-detail image of the master being obtained. The edge steepness of the image was more than 85°.

EXAMPLE 7

A coating solution was prepared from 7.5 pbw of the copolymer described in Example 2, 2.0 pbw of a polyorthoester, prepared by condensation, of 1 mol of 7,7-bishydroxymethylnonanol with 1 mol of methyl orthoformate, 0.8 pbw of bis(t-butylphenylsulfonyl)-diazomethane in 42 pbw of propylene glycol monomethyl ether acetate The solution was filtered through a filter having a pore diameter of 0.2 μm and spun onto a wafer treated with an adhesion promoter (hexamethyldisilazane) at 3,500 revolutions per minute. After drying at 100° C. for 1 minute on a hot plate, a layer thickness of 0.98 μm was obtained.

The copying material was exposed to an image under a master using the UV radiation of a xenon-mercury vapor lamp at 260 nm having an energy of 78 mJ/cm$^2$.

The copying material was developed with a 0.27N aqueous solution of tetramethylammonium hydroxide, the exposed areas being dissolved to leave no residue within 60 seconds and a true-to-detail image of the master being obtained. Lines and gaps down to 0.7 μm were reproduced with faithfulness to the mask.

EXAMPLE 8

The copying material from Example 7 was irradiated with synchrotron radiation (BESSY, Berlin, 754 MeV) through a gold-on-silicon mask with a dose of 160 mJ/cm$^2$. The experimental setup can be found in A. Heuberger, *Microelectr. Eng.*, 3: 535 (1985). After development with the developer described in Example 7 and a development time of 70 seconds, a fault-free image of the mask was obtained down to structures of less than 0.6 μm. The resist edges were virtually vertical to the planar substrate surface.

EXAMPLES 9 AND 10

Comparison Examples

The resist formulation of Example 7 was modified in a manner such that the acid-forming compound used therein was replaced by an equal quantity of triphenylsulfonium hexafluorophosphate (Example 9) or 2-nitrobenzyl tosylate (Example 10).

After exposure to radiation of a wavelength of 260 nm and an energy of 105 or 140 mJ/cm$^2$ and development with a developer of the composition specified in Example 1, structures which exhibited no image differentiation suitable for practical work were obtained.

On using the onium salt (Example 9), structures with so called "resist foot" were obtained, i.e., resist residues adhered to the substrate in the exposed regions, while on using the tosyl ester (Example 10) surface crosslinkings ("lips") were visible and these spanned the substrate areas which had been bared. In both cases no acceptable patterning was obtained.

EXAMPLE 11

To prepare an offset printing plate, a mechanically roughened and pre-treated aluminum foil was spin-coated with a coating solution of the composition below:

7.5 pbw of a cresol-formaldehyde novolak having a softening range of 105° to 120° C., 2.3 pbw of a polyacetal prepared from 1 mol of 2-ethylbutyraldehyde and 1 mol of triethylene glycol, 0.5 pbw of bis(4-chlorophenylsulfonyl)diazomethane, and 0.05 pbw of crystal violet base, in 90 pbw of propylene glycol monomethyl ether acetate.

After drying the layer (layer weight approximately 2.5 g/m$^2$), exposure was carried out under a positive test master for 30 seconds and development was then carried out with a developer of the following composition:

0.5 pbw of sodium hydroxide, 0.8 pbw of sodium metasilicate nonahydrate, 1.0 pbw of 2-n-butoxyethanol in 97.7 pbw of completely softened water.

After rinsing with water, the plate was made ready for printing by wiping over with 1%-strength phosphoric acid. After clamping in a printing press, 72,000 perfect imprints of the master were obtained.

EXAMPLE 12

The solution of an etch and electroplating positive dry resist was prepared by making up the following composition:

12.5 pbw of the novolak described in Example 11, 10.0 pbw of an oligomeric aliphatic polyacetal having a mean molecular weight of approximately 1,400 prepared by condensation of butyraldehyde with diethylene glycol, 0.5 pbw of bis(4-methylphenylsulfonyl)diazomethane, 0.1 pbw of crystal violet in 30 pbw of butanone.

A polyethylene terephthalate film of 25 μm thickness, which is standard for this purpose, was coated with this solution, with the result that a dry layer thickness of 18 μm was produced. The surface of the dry resist film was clad with a further polyethylene terephthalate film. The dry film was laminated onto a brass sheet after peeling off the covering film, under pressure and heat. After cooling and peeling off the temporary support, the sheet was exposed through a master, in which process a good image contrast became visible. The exposed areas were spray-developed with a developer of the composition specified in Example 11. The sheet was then etched with commercial ferrichloride solution until the smooth edges had been etched through. The shaped parts obtained may be processed still further before separation into singles.

What is claimed is:

1. A positive-working radiation-sensitive mixture consisting essentially of, in admixture:
   a) a compound which forms an acid on irradiation, in an amount sufficient to cleave compound b),
   b) a compound having at least one C—O—C or C—O—Si bond which can be cleaved by the acid formed by compound a), said mixture comprising an amount of compound b) sufficient to render the mixture soluble or at least swellable in aqueous-alkaline solution when the acid formed from compound a) upon irradiation cleaves compound b), and
   c) a water-insoluble binder which is soluble or at least swellable in aqueous alkaline solutions, said binder being present in an amount sufficient to form a uniform film when a layer of the positive-working radiation-sensitive mixture is coated on a substrate, wherein the compound (a) is an α,α-bis(sulfonyl)-diazomethane derivative of the formula I

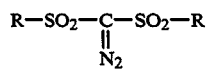

in which R is an alkyl, cycloalkyl, aryl or heteroaryl radical, any of which may be unsubstituted or substituted by one or more substituents.

2. A positive-working radiation-sensitive mixture as claimed in claim 1, wherein the radical R of the compound of the formula I is substituted.

3. A positive-working radiation-sensitive mixture as claimed in claim 1, wherein the radical R of the compound of the formula I is an alkyl radical containing 1 to 6 carbon atoms or an aryl radical.

4. A positive-working radiation-sensitive mixture as claimed in claims 1, wherein the radical R of the compound of the formula I is an aryl radical.

5. A positive-working radiation-sensitive mixture as claimed in claim 1, wherein R is an aromatic radical, the substituents of which are selected from the group consisting of alkyl, alkoxy, alkoxyalkyl, nitro, carbonyl, amido and halogen.

6. A positive-working radiation-sensitive mixture as claimed in claim 1, wherein the mixture is sensitive to UV light having a wavelength of 190 to 450 nm.

7. A positive-working radiation-sensitive mixture as claimed in claim 1, wherein the mixture is sensitive to UV light having a wavelength of 200 to 400 nm.

8. A positive-working radiation-sensitive mixture as claimed in claim 1, wherein the concentration of the acid-forming compound of the formula I is about 0.5 to 25% by weight, based on the total weight of the layer.

9. A positive-working radiation-sensitive mixture as claimed in claim 1, wherein the binder has an absorbance of less than about 0.5 μm$^{-1}$ in the wavelength range of the irradiation.

10. A positive-working radiation-sensitive mixture as claimed in claim 1, comprising up to about 30% by weight of a novolak condensation resin as binder.

11. A positive-working radiation-sensitive mixture as claimed in claim 9, wherein the binder contains phenolic hydroxyl groups.

12. A positive-working radiation-sensitive mixture as claimed in claim 9, wherein the binder is contained in a concentration of about 60 to 96% by weight, in the radiation-sensitive mixture.

13. A positive-working radiation-sensitive mixture as claimed in claim 9, wherein the binder has an absorbance of less than about 0.3 μm$^{-1}$ above 240 nm.

14. A positive-working radiation-sensitive mixture as claimed in claim 1, wherein the compound of the formula I has the highest molar absorption of all the resist constituents at 248 nm.

15. A positive-working radiation-sensitive copying material consisting essentially of:
   a support, and
   a radiation-sensitive layer of a radiation-sensitive mixture as claimed in claim 1 coated on the support.

16. A positive-working radiation-sensitive mixture as claimed in claim 1, comprising up to about 20% by weight of a novolak condensation resin as binder.

17. A positive-working radiation-sensitive mixture as claimed in claim 9, wherein the binder is contained in a concentration of about 70 to 94% by weight, in the radiation-sensitive mixture.

18. A positive-working radiation-sensitive mixture as recited in claim 1, wherein compound b) is a compound having at least one C—O—C bond.

19. A positive-working radiation-sensitive mixture as recited in claim 1, wherein compound b) is a compound having at least one C—O—Si bond.

20. A positive-working radiation-sensitive mixture as claimed in claim 1, wherein compound (a) is bis(4-chlorophenylsulfonyl)diazomethane.

21. A positive-working radiation-sensitive mixture as claimed in claim 1, wherein compound (a) is bis(4-bromophenylsulfonyl)diazomethane.

22. A positive-working radiation-sensitive mixture as claimed in claim 1, wherein compound (a) is bis(phenylsulfonyl)diazomethane.

23. A positive-working radiation-sensitive mixture as claimed in claim 1, wherein compound (a) is bis(t-butylphenylsulfonyl)diazomethane.

24. A positive-working radiation-sensitive mixture as claimed in claim 1, wherein compound (a) is bis(4-methylphenylsulfonyl)diazomethane.

25. A positive-working radiation-sensitive mixture as claimed in claim 1, wherein the radical R of the compound of the formula I is unsubstituted.

* * * * *